United States Patent
Hara et al.

(10) Patent No.: US 10,481,453 B2
(45) Date of Patent: Nov. 19, 2019

(54) METHOD OF PRODUCING DISPLAY PANEL BOARD

(71) Applicant: Sharp Kabushiki Kaisha, Sakai, Osaka (JP)

(72) Inventors: Yoshihito Hara, Sakai (JP); Tohru Daitoh, Sakai (JP); Hajime Imai, Sakai (JP); Masaki Maeda, Sakai (JP); Hideki Kitagawa, Sakai (JP); Toshikatsu Itoh, Sakai (JP); Tatsuya Kawasaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/124,223

(22) Filed: Sep. 7, 2018

(65) Prior Publication Data
US 2019/0079364 A1 Mar. 14, 2019

(30) Foreign Application Priority Data
Sep. 13, 2017 (JP) .................. 2017-175371

(51) Int. Cl.
*G02F 1/1362* (2006.01)
*H01L 33/42* (2010.01)
(Continued)

(52) U.S. Cl.
CPC .. *G02F 1/136286* (2013.01); *H01L 21/02554* (2013.01); *H01L 21/477* (2013.01);
(Continued)

(58) Field of Classification Search
CPC ... G02F 1/136286; G02F 2001/136295; G02F 1/1368; G02F 1/1362; G02F 1/13439; G02F 1/1333; H01L 21/02554; H01L 33/28; H01L 33/0083; H01L 21/477; H01L 33/42; H01L 27/156
See application file for complete search history.

(56) References Cited

U.S. PATENT DOCUMENTS

| 10,388,672 B2* | 8/2019 | Zhang |
| 2011/0013106 A1* | 1/2011 | Liu .................. G02F 1/136286 349/46 |
| 2011/0176081 A1 | 7/2011 | Sonoda et al. |

FOREIGN PATENT DOCUMENTS

JP 2011-151194 A 8/2011

* cited by examiner

*Primary Examiner* — Karen Kusumakar
(74) *Attorney, Agent, or Firm* — Keating & Bennett, LLP

(57) ABSTRACT

A method includes a pixel electrode forming process of forming a pixel electrode formed from a transparent electrode film on a gate insulation film that covers a gate electrode, a semiconductor film forming process being performed after the pixel electrode forming process and forming a semiconductor film on the gate insulation film such that a part of the semiconductor film covers the pixel electrode, an annealing process being performed after the semiconductor film forming process and processing the semiconductor film with annealing, and an etching process being performed after the annealing process and processing the semiconductor film with etching such that a channel section overlapping the gate electrode is formed in a same layer as the pixel electrode. The etching and the annealing performed on one of the transparent electrode film and the semiconductor film is less likely to adversely affect another one of the films.

4 Claims, 6 Drawing Sheets

(51) Int. Cl.
*H01L 21/477* (2006.01)
*H01L 33/00* (2010.01)
*H01L 33/28* (2010.01)
*H01L 21/02* (2006.01)

(52) U.S. Cl.
CPC .......... *H01L 33/0083* (2013.01); *H01L 33/28* (2013.01); *H01L 33/42* (2013.01); *G02F 2001/136295* (2013.01)

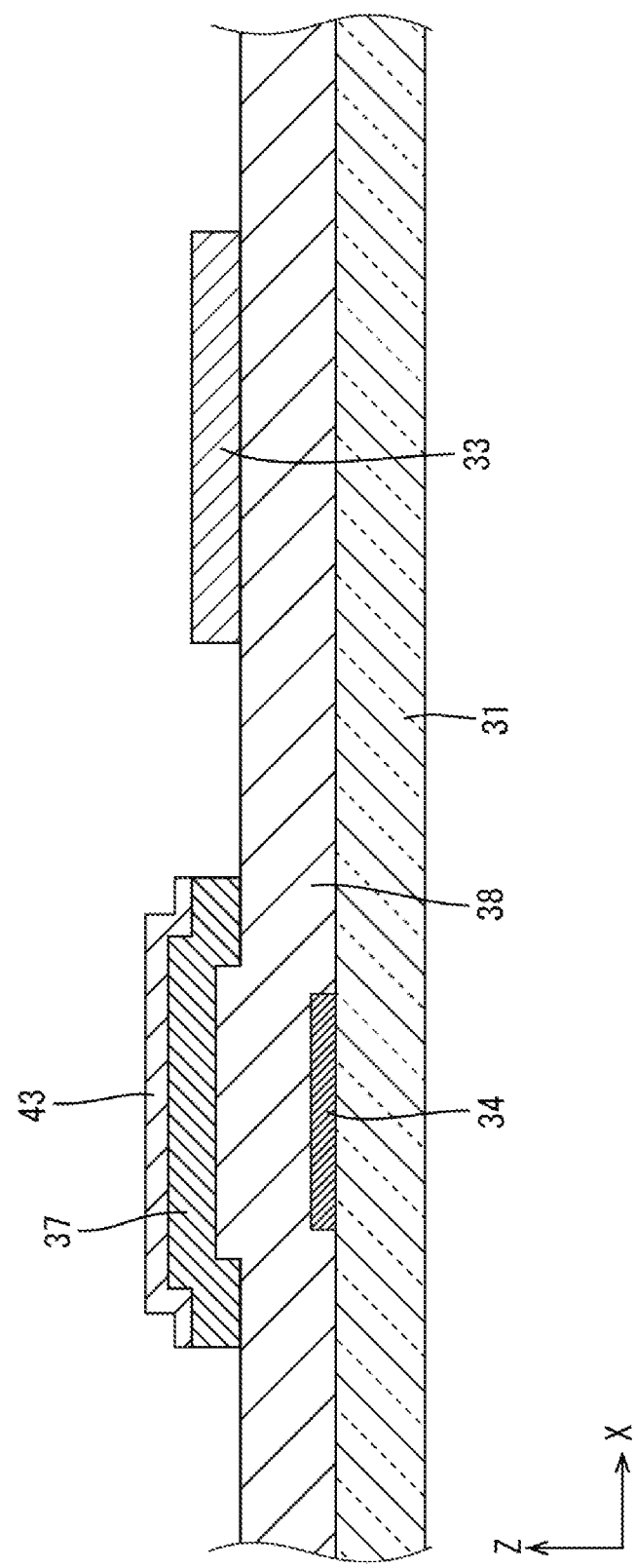

US 10,481,453 B2

METHOD OF PRODUCING DISPLAY PANEL BOARD

CROSS REFERENCE TO RELATED APPLICATION

This application claims priority from Japanese Patent Application No. 2017-175371 filed on Sep. 13, 2017. The entire contents of the priority application are incorporated herein by reference.

TECHNICAL FIELD

The technology described herein relates to a method of producing a display panel board.

BACKGROUND

A display panel board used in a display device described in Japanese Unexamined Patent Application Publication No. 2011-151194 has been known. Such a display panel board includes a transparent substrate and films including gate lines, a gate insulation film, a semiconductor film (a channel section), a source conductive film (and a drain conductive film), an insulation film, and a transparent electrode film (a pixel electrode) that are disposed on the transparent substrate in this order.

In the above configuration, the semiconductor film is connected to the transparent electrode film via the drain conductive film. The insulation film is between the transparent electrode film and the drain conductive film. Therefore, a contact hole is necessary to be formed in the insulation film to connect the transparent electrode film and the drain conductive film. If the transparent electrode film and the semiconductor film are included in the same layer, the contact hole is not necessary to be formed and the number of processes can be reduced. However, in the configuration including the transparent electrode film and the semiconductor film in the same layer, the etching and the annealing performed on one of the films may adversely affect another one of the films.

SUMMARY

The technology described herein was made in view of the above circumstances and an object is to cause less adverse influence on another one of a semiconductor film and a transparent electrode film that are included in a same layer and one of which is subjected to etching or annealing.

To solve the above problems, a method of producing a display panel board according to the present technology includes a pixel electrode forming process of forming a pixel electrode formed from a transparent electrode film on a gate insulation film that covers a gate electrode, a semiconductor film forming process of forming a semiconductor film on the gate insulation film such that a part of the semiconductor film covers the pixel electrode, the semiconductor film forming process being performed after the pixel electrode forming process, an annealing process of processing the semiconductor film with annealing, the annealing process being performed after the semiconductor film forming process, and an etching process of processing the semiconductor film with etching such that a channel section overlapping the gate electrode is formed in a same layer as the pixel electrode, the etching process being performed after the annealing process.

The channel section (the semiconductor film) and the pixel electrode (the transparent electrode film) are included in the same layer. According to such a configuration, the channel section is connected to the pixel electrode without using any contact hole and the number of processes for forming the contact hole is reduced. In the annealing process, the semiconductor film is processed with the annealing and the semiconductor film is stabilized. In the annealing process, the pixel electrode is covered with the semiconductor film. According to such a configuration, the pixel electrode is less likely to be provided with oxygen and white turbidity or powdering of the pixel electrode is less likely to be caused. Since the pixel electrode is heated in the annealing process, another heating process for crystalizing the pixel electrode is not necessary to be performed separately and the number of processes can be reduced. In a configuration including the semiconductor film (the channel section) and the transparent electrode film (the pixel electrode) in the same layer, the treatment performed on one of the semiconductor film and the transparent electrode film are less likely to adversely affect another one of the films.

According to the technology described herein, in a configuration including a semiconductor film and a transparent electrode film in a same layer, the etching and the annealing performed on one of the semiconductor film and the transparent electrode film are less likely to adversely affect another one of the films.

BRIEF DESCRIPTION OF THE DRAWINGS

FIG. 6 is a cross-sectional view illustrating a board in an etching process.

DETAILED DESCRIPTION

Figure 1:
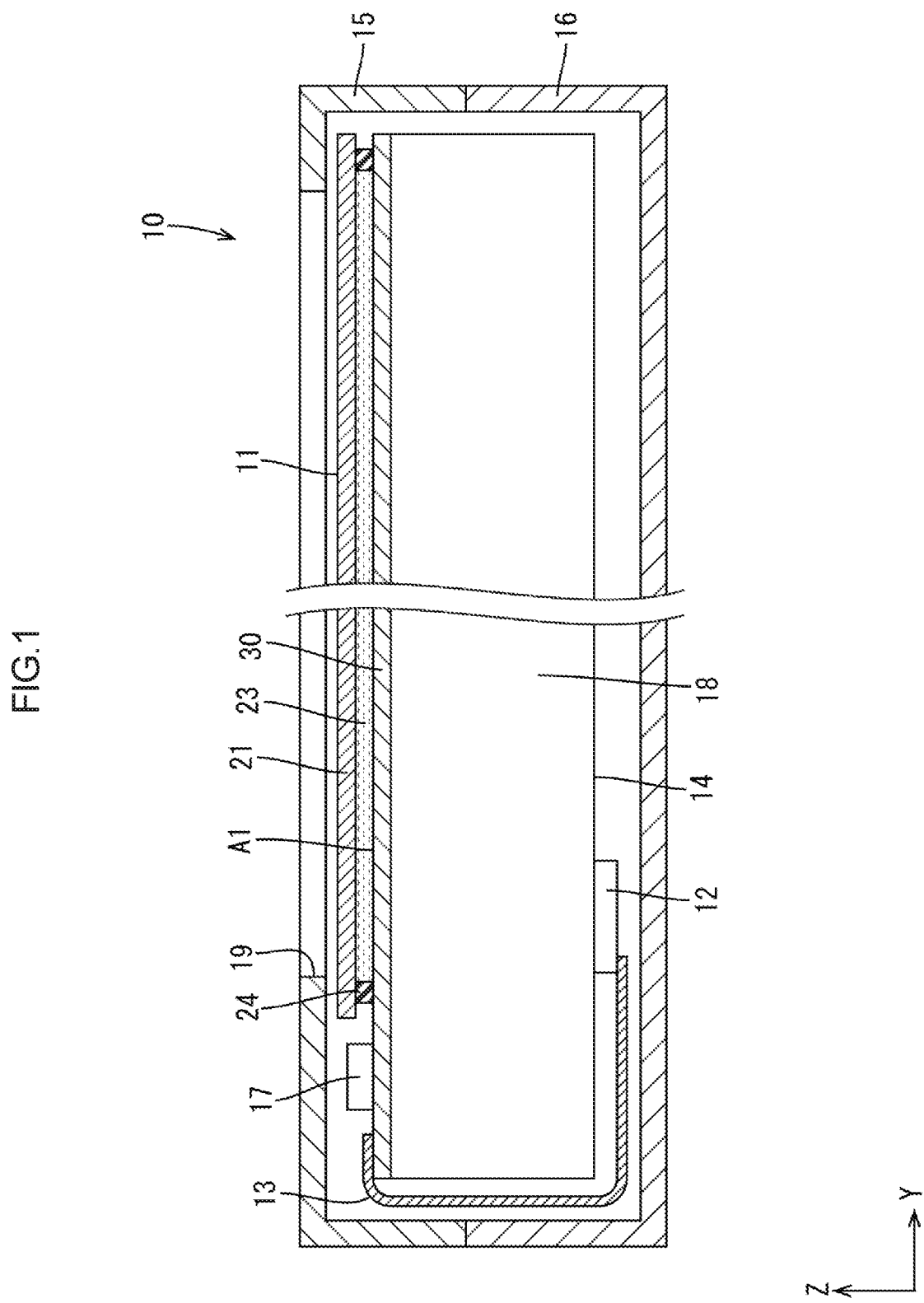
FIG. 1 is a cross-sectional view illustrating a liquid crystal display device according to one embodiment taken along a cutting line in a longitudinal direction thereof (a Y-axis direction).

One embodiment according to the technology described herein will be described with reference to FIGS. 1 to 6. As illustrated in FIG. 1, a liquid crystal display device 10 includes a liquid crystal panel 11 (a display panel), a driver 17 (a panel driving portion) that drives the liquid crystal panel 11, a control circuit board 12 (an external signal supply source) that supplies various kinds of input signals to the driver 17, a flexible printed board 13 (an external connecting component) that electrically connects the liquid crystal panel 11 and the external control circuit board 12, and a backlight device 14 (a lighting device) that is an external light source and supplies light to the liquid crystal panel 11. As illustrated in FIG. 1, the backlight device 14 includes a chassis 18, light sources (e.g., cold cathode fluorescent tubes, LEDs, organic ELs), and an optical member. The chassis 18 has a box-like shape with an opening on the front (on a liquid crystal panel 11 side). The light sources, which are not illustrated, are disposed inside the chassis 18. The optical member, which is not illustrated, is arranged so as to cover the opening of the chassis 18. The optical member has a function to convert light from the light sources into planar light.

As illustrated in FIG. 1, the liquid crystal display device 10 further includes a pair of exterior components 15 and 16 that are front and rear components used in a pair to hold the liquid crystal panel 11 and the backlight device 14 that are attached together. The exterior component 15 on the front has an opening 19 through which images displayed in a display section A1 of the liquid crystal panel 11 are viewed from the outside. The liquid crystal display device 10 may be used in various kinds of electronic devices (not illustrated) such as mobile phones (including smartphones), notebook computers (including tablet computers), wearable terminals (including smart watches), handheld terminals (including electronic books and PDAs), portable video game players, and digital photo frames.

As illustrated in FIG. 1, the liquid crystal panel 11 includes a pair of substrates 21 and 30, a liquid crystal layer 23 (a medium layer) between the substrates 21 and 30, and a sealing member 24 that is between the substrates 21 and 30. The liquid crystal layer 23 includes liquid crystal molecules having optical characteristics that vary according to application of electric field. The sealing member 24 surrounds and seal the liquid crystal layer 23. One of the substrates 21 and 30 on the front (a front surface side, an upper side in FIG. 1) is a CF board 21 (a counter substrate) and one on the rear (on a back surface side) is an array board 30 (an active matrix substrate, a component-side substrate). The liquid crystal molecules included in the liquid crystal layer 23 are aligned about horizontally. However, it is not limited thereto. Polarizing plates, which are not illustrated, are attached to outer surfaces of the substrates 21 and 30, respectively.

The CF board 21 includes color filters, an overcoat film, and an alignment film (not illustrated) that are disposed in layers on an inner surface (a surface opposite the liquid crystal layer 23) of a glass substrate (not illustrated). The color filters include color portions (not illustrated) of three colors including red (R), green (G), and blue (B), and the color portions are arranged in a matrix. Each of the color portions is opposite each of the pixels on the array board 30.

Figure 2:
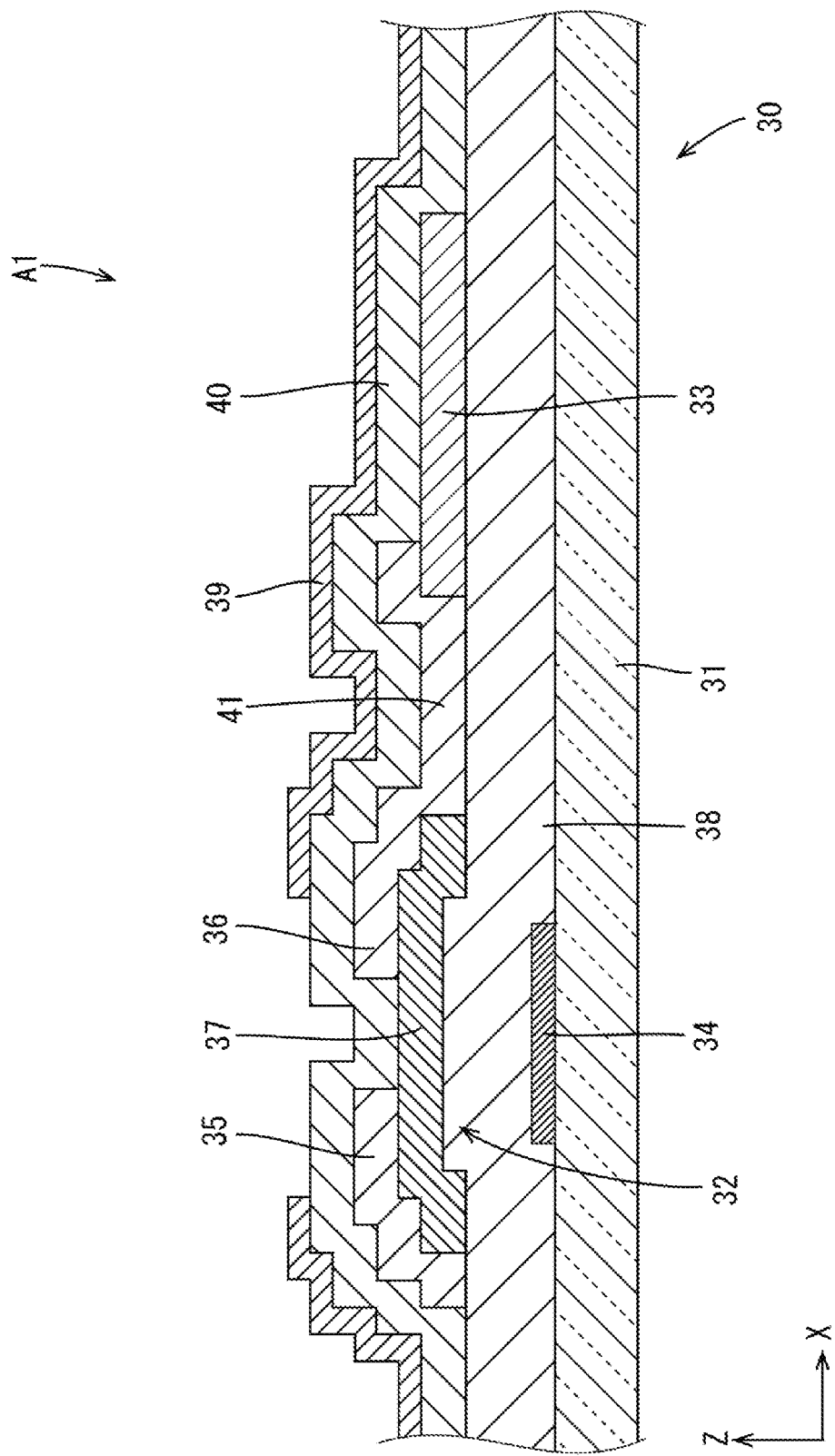
FIG. 2 is a cross-sectional view illustrating an array board.

As illustrated in FIG. 2, the array board 30 (a display panel board) includes various kinds of films in layers on an inner surface of the glass substrate 31 with the photolithography method. The array board 30 includes thin film transistors (TFTs) 32, which are switching components, and pixel electrodes 33 in the display section A1 of the inner surface thereof (a surface opposite the liquid crystal layer 23, an upper side in FIG. 2). The TFTs 32 and the pixel electrodes 33 are arranged in a matrix (in column and rows). Gate lines and source lines, which are not illustrated, are routed in a matrix around the TFTs 32 and the pixel electrodes 33.

Each TFT 32 includes a gate electrode 34, a source electrode 35, a drain electrode 36, and a channel section 37. The gate electrode 34 is connected to the gate line and the source electrode 35 is connected to the source line. The channel section 37 is overlapped with the gate electrode 34 and the gate insulation film 38 is between the channel section 37 and the gate electrode 34. The channel section 37 bridges the source electrode 35 and the drain electrode 36 and the pixel electrode 33 is included in the layer same as the channel section 37 (on the gate insulation film 38). The TFTs 32 are driven based on various kinds of signals supplied to the gate line and the source line and supply of a potential to each of the pixel electrodes 33 is controlled according to the driving. The gate electrodes 34, the source electrodes 35, and the drain electrodes 36 are formed from, for example, multilayered film including titanium (Ti) and copper (Cu). However, it is not limited thereto.

A common electrode 39 is disposed on a front side of the pixel electrodes 33 on the array board 30. An interlayer insulation film 40 is between the pixel electrode 33 and the common electrode 39. The gate insulation film 38 and the interlayer insulation film 40 are included in a multilayer film including silicon oxide ($SiO_2$) and silicon nitride ($SiN_x$). However, it is not limited thereto. The common electrode 39 includes slits (not illustrated). When a potential difference appears between the pixel electrode 33 and the common electrode 39 that are overlapped with each other according to charging of the pixel electrode 33, a fringe field (an oblique field) including a component in a direction normal to a plate surface of the array board 30 is generated between a slit opening edge of the common electrode 39 and the pixel electrode 33 in addition to a component in a direction along the plate surface of the array board 30. Therefore, alignment of the liquid crystal molecules included in the liquid crystal layer 23 can be controlled using the fringe field. Namely, the liquid crystal panel 11 of this embodiment includes an FFS (fringe filed switching) mode as an operation mode.

Next, a method of producing the liquid crystal panel 11 will be described. The liquid crystal panel 11 is produced by producing the CF board 21 and the array board 30, respectively, and then bonding the CF board 21 and the array board 30 together. A method of producing the array board 30 at least includes a gate conductive film forming process of forming the gate electrode 34 and the gate lines, a gate insulation film forming process of forming the gate insulation film 38, a pixel electrode forming process of forming the pixel electrode 33, a channel section forming process of forming the channel section 37, a source and drain forming process of forming the source electrode 35, the source lines, the drain electrode 36, and the interlayer insulation film 40, and a common electrode forming process of forming the common electrode 39.

In each of the above processes, a thin film pattern is formed with the photolithography method. Specifically, each of the above processes includes a film forming process, a resist forming process, and an etching process. In the film forming process, a thin film that is a base for the thin film pattern is formed. In the resist forming process, the resist is subjected to an exposure treatment and a developing treatment such that a resist pattern corresponding with the thin film pattern is formed. In the etching process, the film having the resist pattern as a mask is subjected to the etching and the thin film pattern is formed. In the film forming process, according to a type of the thin film, a method of film forming is properly used such as the plasma CVD method, the sputtering method, and the vacuum vapor deposition method. In the etching process, according to a type of the thin film to be subjected to the etching, the wet etching or the dry etching is property performed.

Different photomasks are used for forming the thin film patterns for the gate, the pixel electrode 33, the channel section 37, the source and drain, the interlayer insulation film 40, and the common electrode 39 on the array board 30. The array board 30 of this embodiment includes no flattening film and accordingly, the number of the photomasks is reduced. With the configuration without including a flattening film, the distance between the common electrode 39 and the source (and the drain) is small and parasitic capacitance is likely to be greater. Therefore, the interlayer insulation film 40 has a thickness that is from twice to triple of normal thickness (for example, 400 nm to 800 nm) so that the parasitic capacitance between the common electrode 39 and the source (and the drain) can be small and shadowing is less likely to be caused.

Figure 3:
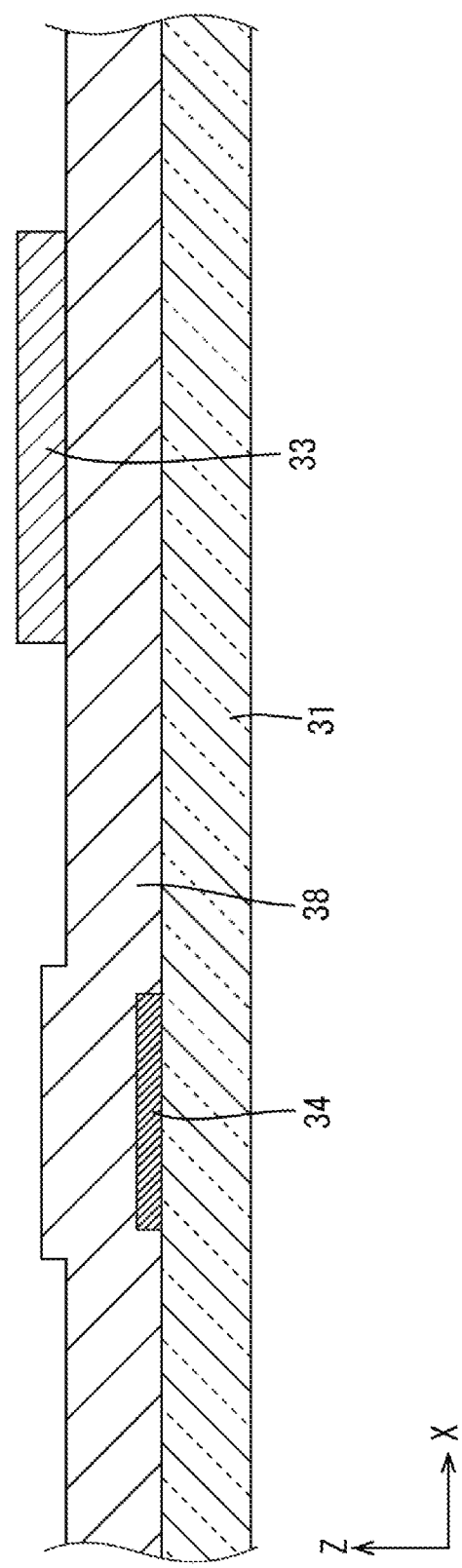
FIG. 3 is a cross-sectional view illustrating a board in a pixel electrode forming process.

In the following description, among the processes, the pixel electrode forming process and the channel section forming process will be mainly described. In the pixel electrode forming process, after the transparent electrode film is formed on the gate insulation film 38, a resist (a photoresist) is formed on the transparent electrode film and the resist is subjected to exposure through a certain photomask and the exposed resist is developed and thus a resist pattern with patterning is formed. The transparent electrode film is subjected to etching with the resist pattern being used as the mask and the pixel electrode 33 is formed as illustrated in FIG. 3. Then, the resist pattern on the pixel electrode 33 is removed. For example, indium tin oxide (ITO) is used as the transparent electrode film of the pixel electrode 33 and wet etching using oxalic acid is performed as the etching treatment.

Figure 4:
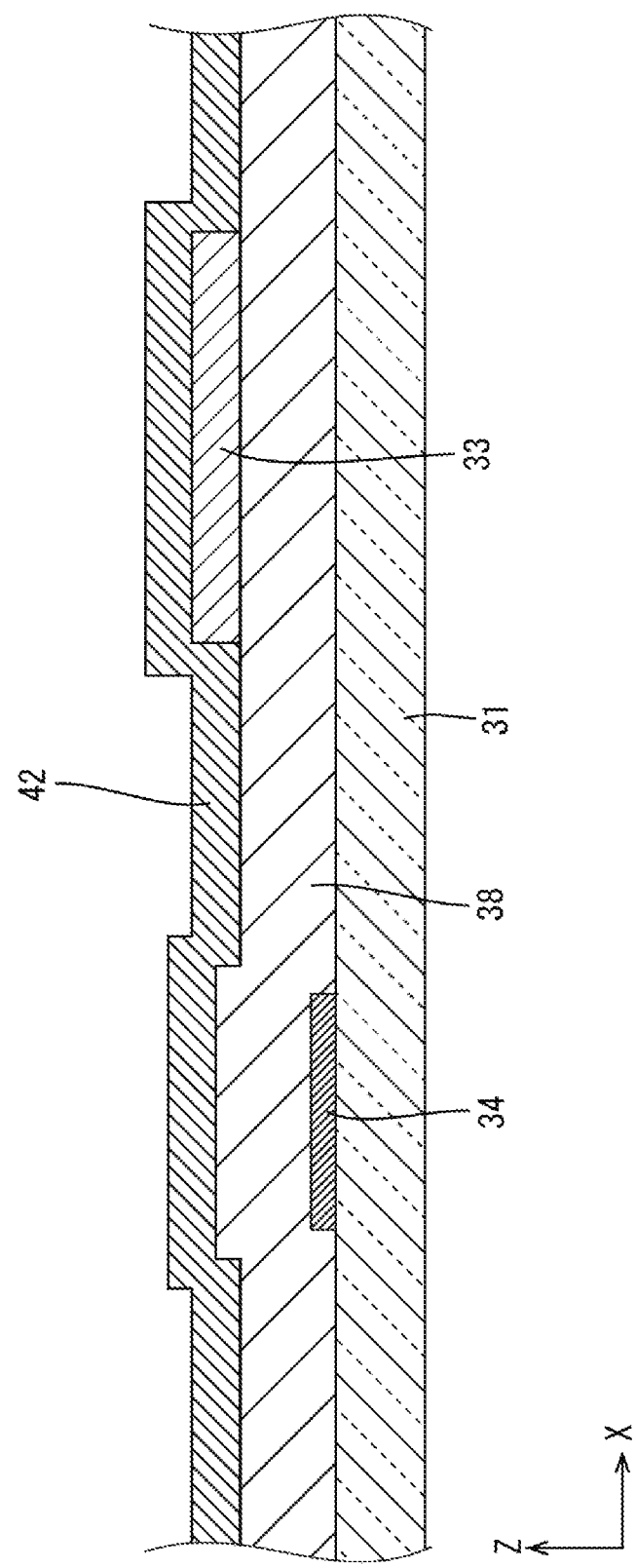
FIG. 4 is a cross-sectional view illustrating a board in a semiconductor film forming process.

The channel section forming process includes a semiconductor film forming process, an annealing process, a resist forming process, and an etching process. As illustrated in FIG. 4, in the semiconductor film forming process, a semiconductor film 42 that is a base for the channel section 37 is formed on the gate insulation film 38. The semiconductor film 42 is formed on the gate insulation film 38 such that a part thereof covers the pixel electrode 33. In the annealing process, the annealing treatment is performed on the semiconductor film 42 by heating. The annealing treatment is performed at a temperature from 350° C. to 450° C. for a certain period (for example, from 20 minutes to 60 minutes) in an $O_2$ atmosphere (DRY air). The annealing treatment is a heating treatment for improving mobility (lowering resistance) or stabilizing characteristics. In the annealing process, the pixel electrode 33 that is covered with the semiconductor film 42 is heated and crystalized.

Figure 5:
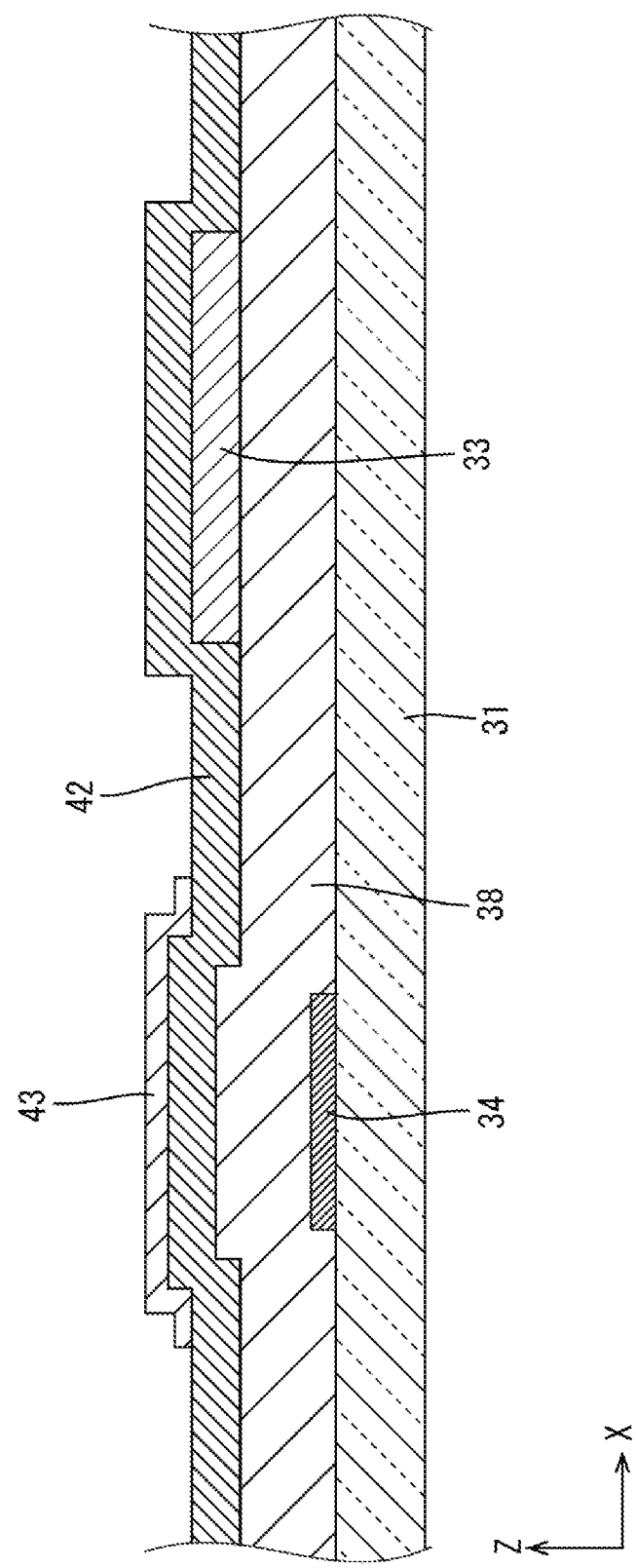
FIG. 5 is a cross-sectional view illustrating a board in a resist forming process.

In the resist forming process, the resist (a photoresist) is disposed on the semiconductor film 42 and is exposed through a certain photomask. Then, the exposed resist is developed and the resist pattern 43 is formed with patterning as illustrated in FIG. 5. In the etching process, the semiconductor film 42 is processed with etching with the resist pattern 43 being used as a mask so that the channel section 37 is formed in the same layer as the pixel electrode 33 as illustrated in FIG. 6. Then, the resist pattern 43 is removed. Oxide semiconductors (In—Ga—Zn—O semiconductors) containing indium (In), gallium (Ga), and zinc (Zn) is used as the semiconductor film 42 and in such a configuration, wet etching is performed using etchant of a PAN type including phosphoric acid, nitric acid, and acetic acid that are mixed.

In the source and drain forming process (the drain forming process) that is performed after the channel section forming process, a conductive film for forming the source and the drain is formed and the conductive film is processed with etching with using the resist pattern as a mask and a thin film pattern for the source and the drain is formed. As illustrated in FIG. 2, in the source and drain forming process, the drain electrode 36 and the drain line 41 (the drain conductive film) are disposed for connecting the channel section 37 and the pixel electrode 33. If the conductive film forming the source and drain is a multilayer film including titanium (Ti) and copper (Cu), the thin film pattern of copper is formed with wet etching and the thin film pattern of titanium is formed with dry etching.

The In—Ga—Zn—O semiconductor is ternary oxide of indium (In), gallium (Ga), and zinc (Zn). A ratio (composition ratio) of indium (In), gallium (Ga), and zinc (Zn) is not limited and may be In:Ga:Zn=2:2:1, In:Ga:Zn=1:1:1, or In:Ga:Zn=1:1:2, for example. In this embodiment, the In—Ga—Zn—O semiconductor contains In, Ga, and Zn at a ratio of 1:1:1. The oxide semiconductor (the In—Ga—Zn—O semiconductor) may be amorphous or may be preferably crystalline. The crystalline oxide semiconductor may be preferably a crystalline In—Ga—Zn—O semiconductor having c-axis oriented vertical to a layer surface. A crystalline structure of such an oxide semiconductor (In—Ga—Zn—O semiconductor) is disclosed in JPA 2012-134475, for example. The entire contents of JPA 2012-134475 are incorporated herein by reference.

Next, effects of this embodiment will be described. In this embodiment, the channel section 37 (the semiconductor film) and the pixel electrode 33 (the transparent electrode film) are included in the same layer. According to such a configuration, the channel section 37 is connected to the pixel electrode 33 without using any contact hole and the number of processes for forming the contact hole is reduced. In the annealing process, the semiconductor film 42 is processed with the annealing and the resistance of the semiconductor film 42 is lowered. In the annealing process, the pixel electrode 33 is covered with the semiconductor film 42. According to such a configuration, the pixel electrode 33 is less likely to be provided with oxygen and white turbidity or powdering of the pixel electrode 33 is less likely to be caused. In the annealing process, the pixel electrode 33 and the semiconductor film 42 are heated together and crystalized. Therefore, when the semiconductor film 42 is processed with etching in the etching process, the pixel electrode 33 is less likely to be processed with etching. Since the pixel electrode 33 is heated in the annealing process, another heating process for crystalizing the pixel electrode 33 is not necessary to be performed separately and the number of processes can be reduced.

The transparent electrode film of the pixel electrode 33 is indium tin oxide (ITO) and the semiconductor film 42 is an oxide semiconductor containing indium (In), gallium (Ga), zinc (Zn), and oxygen (O). ITO and the oxide semiconductor containing indium (In), gallium (Ga), zinc (Zn), and oxygen (O) have a similar composition. Therefore, the method of etching used in the etching of the semiconductor film 42 is usually preferable for etching the pixel electrode 33. For example, the etchant of a PAN type has a property capable of etching the semiconductor film 42 and the pixel electrode 33. In this embodiment, since the semiconductor film 42 is processed with etching after the pixel electrode 33 is crystalized, the pixel electrode 33 is less likely to be affected by etching even if the pixel electrode 33 and the semiconductor film 42 have a similar composition. Therefore, the present embodiment is preferable.

In the annealing process, the annealing is performed at the temperature of from 350° C. to 450° C. By performing the annealing process under the above temperature range, the semiconductor film 42 is further stabilized and reliability of the TFTs 32 can be improved (the property of the TFTs is stabilized).

The drain forming process of forming the drain electrode 36 and the drain line 41 that connect the channel section 37 and the pixel electrode 33 is included. The drain forming process is performed after the etching process. The channel section 37 and the pixel electrode 33 are included in the same layer and according to such a configuration, the drain line 41 is connected to the pixel electrode 33 without using a contact hole.

Other Embodiments

The technology disclosed herein is not limited to the embodiments, which have been described using the foregoing descriptions and the drawings. For example, embodiments described below are also included in the technical scope.

(1) The above embodiment may be configured such that the common electrode 39 maybe divided into multiple electrodes and each of the electrodes may function as a touch sensor (a configuration of an in-cell type). In such a configuration of the in-cell type, lines for touch sensors may be formed at the same time of forming the source and the drain by using the conductive film for the source and the drain. Therefore, the lines for the touch sensors are formed without increasing the number of photomasks.

(2) The material of the semiconductor film 42 is not limited to those described in the above embodiment section and may be altered as appropriate. For example, amorphous silicon may be used as the semiconductor film 42. The TFTs including the In—Ga—Zn—O semiconductors have higher mobility compared to TFTs including amorphous silicon and can be reduced in size and preferable.

(3) The material of the pixel electrode 33 is not limited to those described in the above embodiment section and may be altered as appropriate. For example, Zinc Oxide (ZnO) may be used as the pixel electrode 33.

(4) The conditions for the annealing (such as the atmosphere, the temperature, and the time) are not limited to those described in the above embodiment section and may be altered as appropriate according to the material of the semiconductor film 42.

(5) In the above embodiment, another interlayer insulation film may be disposed on the interlayer insulation film 40. According to such a configuration, a parasitic capacitance between the common electrode 39 and the source (and the drain) can be controlled.

The invention claimed is:

1. A method of producing a display panel board comprising:
   a pixel electrode forming process of forming a pixel electrode formed from a transparent electrode film on a gate insulation film that covers a gate electrode;
   a semiconductor film forming process of forming a semiconductor film on the gate insulation film such that a part of the semiconductor film covers the pixel electrode, the semiconductor film forming process being performed after the pixel electrode forming process;
   an annealing process of processing the semiconductor film with annealing, the annealing process being performed after the semiconductor film forming process; and
   an etching process of processing the semiconductor film with etching such that a channel section overlapping the gate electrode is formed in a same layer as the pixel electrode, the etching process being performed after the annealing process.

2. The method according to claim 1, wherein
   the transparent electrode film is formed from indium tin oxide (ITO), and
   the semiconductor film is formed from an oxide semiconductor containing indium (In), gallium (Ga), zinc (Zn), and oxygen (O).

3. The method according to claim 2, wherein in the annealing process, the annealing treatment is performed at a temperature from 350° C. to 450° C.

4. The method according to claim 1, further comprising a drain forming process of forming a drain electrode and a drain line that connect the channel section and the pixel electrode, the drain forming process being performed after the etching process.

* * * * *